(12) United States Patent
Eun

(10) Patent No.: US 7,442,990 B2
(45) Date of Patent: Oct. 28, 2008

(54) SEMICONDUCTOR DEVICE HAVING A RECESS CHANNEL AND METHOD FOR FABRICATING THE SAME

(75) Inventor: Byung Soo Eun, Seoul (KR)

(73) Assignee: Hynix Semiconductor Inc., Icheon-shi (KR)

( * ) Notice: Subject to any disclaimer, the term of this patent is extended or adjusted under 35 U.S.C. 154(b) by 52 days.

(21) Appl. No.: 11/294,906

(22) Filed: Dec. 6, 2005

(65) Prior Publication Data

US 2006/0237783 A1 Oct. 26, 2006

(30) Foreign Application Priority Data

Apr. 26, 2005 (KR) ...................... 10-2005-0034762

(51) Int. Cl.
*H01L 29/94* (2006.01)
(52) U.S. Cl. ...................................... 257/328; 257/330
(58) Field of Classification Search ............... 257/905, 257/E27.084, 328, 330
See application file for complete search history.

(56) References Cited

U.S. PATENT DOCUMENTS

| 7,244,650 B2 * | 7/2007 | Suh ............................. 438/253 |
| 2004/0150056 A1 | 8/2004 | Yang et al. ................... 257/412 |
| 2004/0195608 A1 | 10/2004 | Kim et al. ..................... 257/296 |
| 2005/0077568 A1 * | 4/2005 | Park et al. ..................... 257/330 |
| 2006/0205162 A1 * | 9/2006 | Suh ............................. 438/286 |

* cited by examiner

*Primary Examiner*—Douglas M Menz
(74) *Attorney, Agent, or Firm*—Marshall, Gerstein & Borun LLP

(57) ABSTRACT

Provided is a semiconductor device having recess channel, comprising a semiconductor substrate having first and second trenches disposed to cross each other on both sides of an active region among adjoining regions between an active region and element-isolation films; a gate insulation film disposed on the semiconductor substrate of the active region; a first gate line disposed on the gate insulation film, and crossing the active region and overlapping with the first trench; and a second gate line disposed on the gate insulation film, and crossing the active region while overlapping with the second trench.

3 Claims, 8 Drawing Sheets

SEMICONDUCTOR DEVICE HAVING A RECESS CHANNEL AND METHOD FOR FABRICATING THE SAME

BACKGROUND OF THE INVENTION

1. Field of the Invention

The present invention relates to a method for fabricating a semiconductor device having recess gate to improve refresh characteristics.

2. Description of the Related Art

With increased integration in semiconductor devices, a process to improve refresh characteristics of capacitors is receiving a great deal of attention. In semiconductor memory devices, for example, volatile memories such as dynamic random access memories (DRAMs), periodic refresh thereof plays a very important role in manufacturing processes of devices. Recently, a great deal of research into the improvement of refresh characteristics has been made, and inter alia, a liner nitride film is utilized as a material for improving refresh characteristics. The liner nitride film serves to prevent passage of an oxygen source through trench isolation films in a subsequent oxidation process for forming a gate insulation film, and is already well known as contributing to the reduction of leakage current, thereby improving refresh characteristics of DRAMs. In addition, in order to improve the refresh characteristics of DRAMs, an approach entailing replacement of a capacitor material with a high-dielectric constant material has been proposed. Exemplary capacitor materials into which a great deal of research has been conducted are hafnium oxide ($HfO_2$) and aluminum oxide ($Al_2O_3$). However, as the above-mentioned methods exhibit limitations in improving the refresh characteristics of devices, recent research has been focused on semiconductor devices having recessed channels.

FIG. 1 is an SEM showing a semiconductor device having recessed channels in accordance with a conventional art.

Referring to FIG. 1, in the semiconductor device having recessed channels, trenches are formed at a predetermined depth from a surface of a semiconductor substrate 100, gate stacks 112 are disposed on the trenches, and source/drain impurities are implanted to form a channel A. The respective gate stacks 112 may be formed including a gate oxide film pattern 104, a conductive film pattern 106, a metal film pattern 108 and a hard mask film pattern 110. Spacer films 114 are disposed on sides of the gate stacks 112. Such a semiconductor device having recessed channels 116 has a relatively long gate channel length as compared to a semiconductor device having plane channels. An increased gate channel length results in elevation of cell threshold voltage, and as a result, an amount of impurities, which are implanted to lower cell threshold voltage to a predetermined level, i.e., boron difluoride ($BF_2$), may be decreased. Decreasing the amount of $BF_2$, which are impurities for control of cell threshold voltage, increases the width of a depletion layer positioned at a source/drain in cell regions, and decreases the amount of electric field, thereby resulting in decreased junction leakage current and gate induced drain leakage (GIDL), and as a result, it is possible to increase the refresh characteristics to about twice, those of a semiconductor device having a plane channel.

FIG. 2a is an SEM illustrating problems exhibited in a semiconductor device having recess gates in accordance with the conventional art. FIG. 2c is a drawing equivalent of FIG. 2a, illustrating with greater clarity the location of elements 208 and plane X-X'.

FIG. 2b is an SEM showing a cross-section taken along X-X' direction of FIG. 2a and FIG. 2c.

Referring to FIG. 2a to FIG. 2c, in fabricating a semiconductor device having recess gates, sharp silicon protrusions remained (hereinafter, referred to as "horns") (as represented by reference numeral 208 in FIG. 2a to FIG. 2c) in the adjoining regions between an active region 200, which is a recess channel region, and isolation regions 202, due to a difference in the etching rate between the semiconductor substrate and isolation films. Occurrence of such horns 208, when electric current passes through gate electrodes, leads to localized electric-field enhancement in the region where horns occurred, thereby severely lowing cell threshold voltage. Herein, details of sidewall oxide films 204 and liner nitride films 206 are omitted in FIG. 2b. Occurrence of horns 208 also sharply increases dependence on back bias. That is, slight changes in back bias result in significant changes in threshold voltage. Further, as a length of a gate channel is increased, resistance thereof is increased and driving current is rapidly decreased.

SUMMARY OF THE INVENTION

Therefore, the present invention has been made in view of the above problems, and it is an object of the present invention to provide a method for fabricating a semiconductor device having recess channel, which improve electrical properties of recess channel by reducing channel resistance to increase the amount of driving current.

In accordance with an aspect of the present invention, the above and other objects can be accomplished by the provision of a semiconductor device having recess channel, comprising: a semiconductor substrate having first and second trenches disposed to cross each other on both sides of the active region among adjoining regions between the active region and isolation films;

a gate insulation film disposed on the semiconductor substrate of the active region;

a first gate line disposed on the gate insulation film, and crossing the active region while overlapping with the first trench; and a second gate line disposed on the gate insulation film, and crossing the active region while overlapping with the second trench.

In the present invention, the first gate line has a relatively large width on the opposite side of the first trench.

The second gate line has a relatively large width on the opposite side of the second trench.

In accordance with another aspect of the present invention, there is provided a method, for fabricating a semiconductor device having recess channel, comprising:

providing a semiconductor substrate having an active region and isolation regions defined thereon;

forming a mask film pattern on the semiconductor substrate such that both sides of the active region, among adjoining regions between the active region and isolation regions, are exposed to cross each other;

performing an etching process using the mask film pattern as a mask, thereby forming first and second trenches;

forming a gate insulation film on the semiconductor substrate having the first and second trenches formed thereon; and forming a first and second gate lines overlapping with the first and second trenches, respectively, on the gate insulation film.

BRIEF DESCRIPTION OF THE DRAWINGS

The above and other objects, features and other advantages of the present invention will be more clearly understood from the following detailed description taken in conjunction with the accompanying drawings, in which:

FIG. 2b is an SEM showing a cross-section taken along X-X' direction of FIG. 2a; and FIG. 2c is a drawing equivalent of the SEM photograph of FIG. 2a.

DESCRIPTION OF THE PREFERRED EMBODIMENTS

Figure 1:
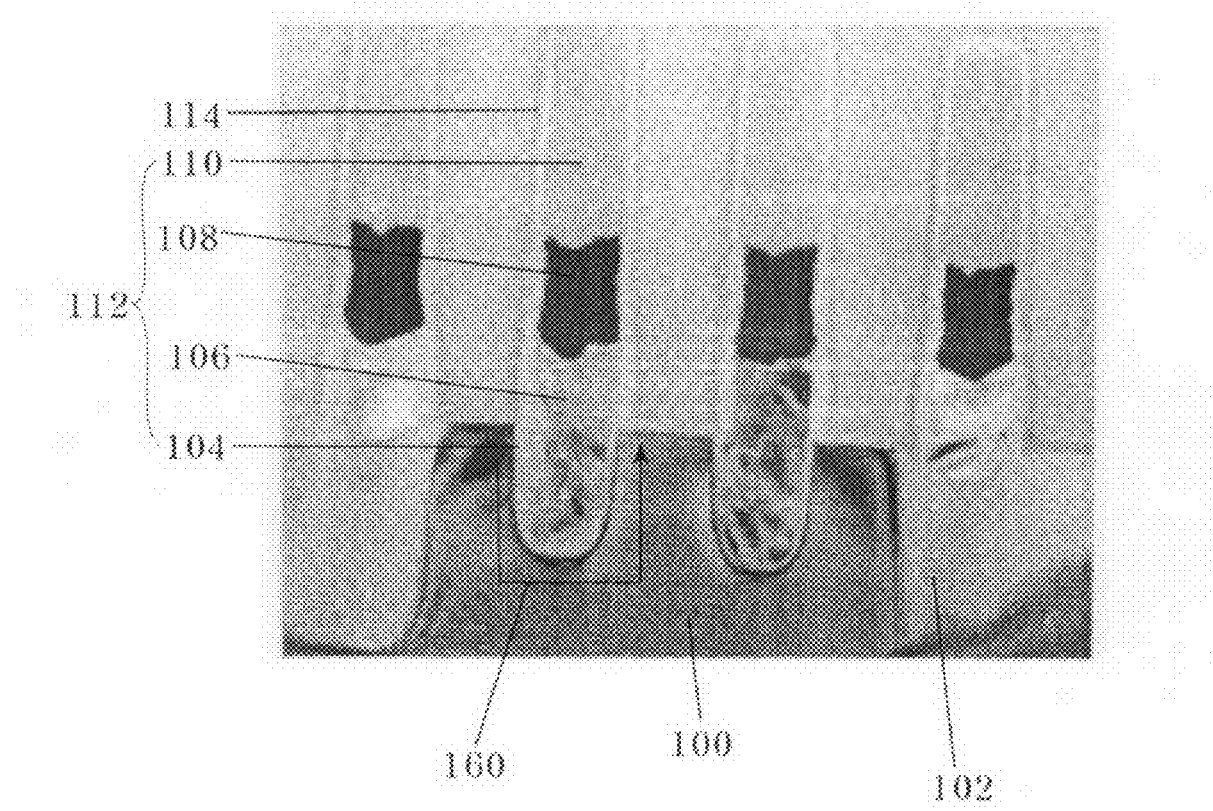
FIG. 1 is an SEM showing a semiconductor device having recessed channels in accordance with a conventional art.
Figure 2A:
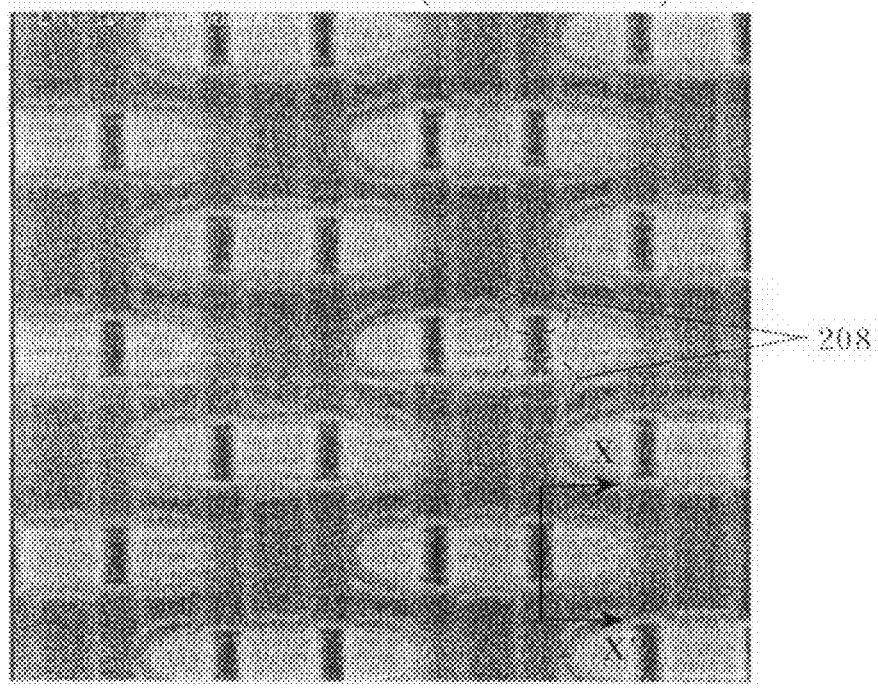
FIG. 2a is an SEM illustrating problems exhibited in a semiconductor device having recess gates in accordance with a conventional art.
Figure 2B:
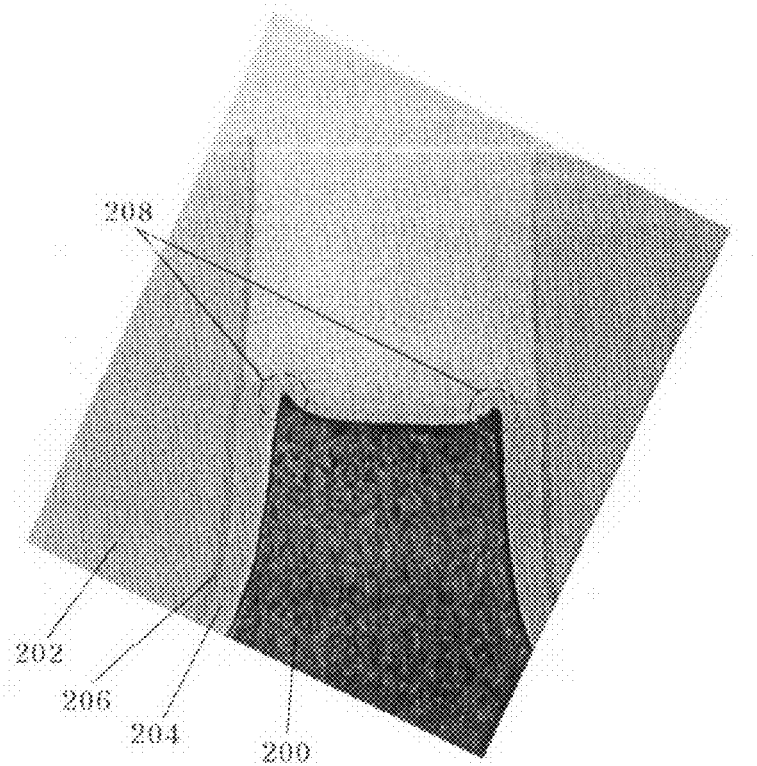
Figure 2C:
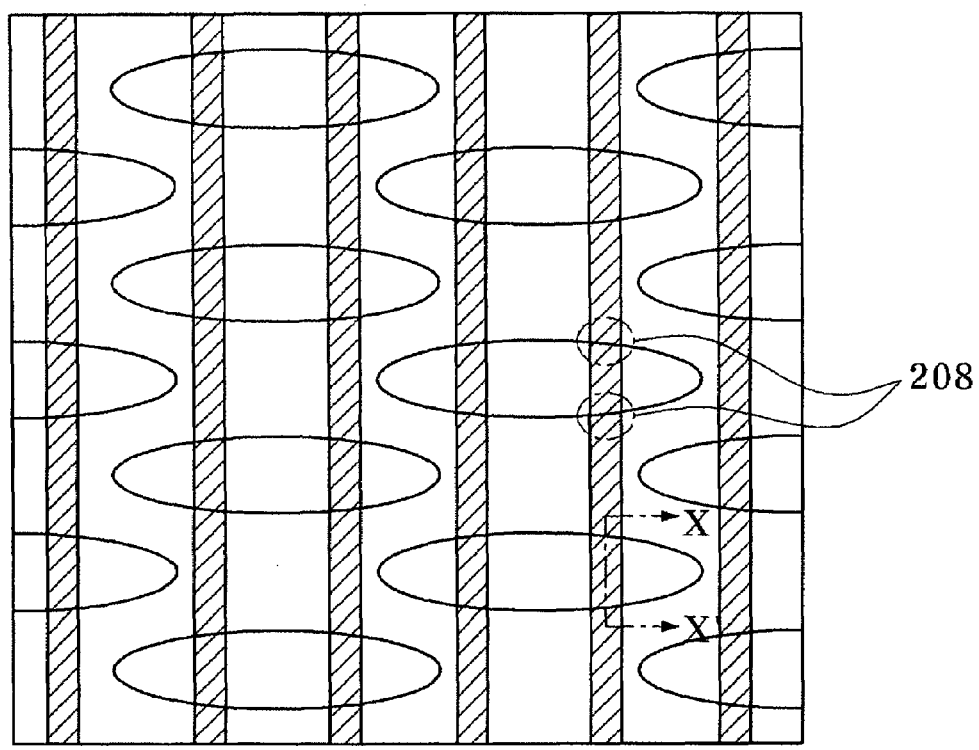

The present invention will now be described more fully with reference to the accompanying drawings hereinafter, in which preferred embodiments of the invention are shown. This invention may, however, be embodied in different forms and should not be construed as limited to the embodiments set forth herein. In the drawings, thicknesses of various layers and regions are exaggerated for clarity. Like numbers refer to like elements throughout the specification and drawings.

FIGS. 3a through 7b are views illustrating a semiconductor device having recess channel in accordance with the present invention and a method for fabricating the same.

As shown in FIG. 3a, a pad oxide film and a pad nitride film (not shown) are formed on a semiconductor substrate 300, and the semiconductor substrate is then etched with an etch mask defining isolation regions, thereby forming trenches (not shown). Subsequently, the inner parts of the trenches are filled with an oxide film and are subjected to chemical mechanical polishing (CMP) to form isolation films 302. Next, the pad nitride film is removed using a solution of phosphoric acid ($H_3PO_4$), thereby defining the active region (Y) and isolation regions (Z).

Figure 3B:
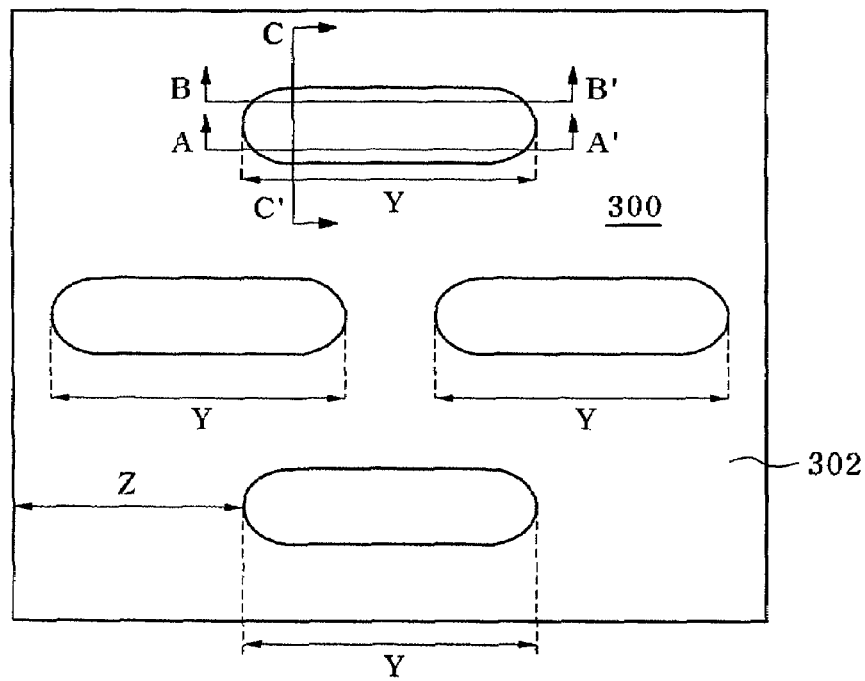
FIGS. 3a through 7b are views illustrating a semiconductor device having recess channel in accordance with the present invention and a method for fabricating the same.
Figure 3B:
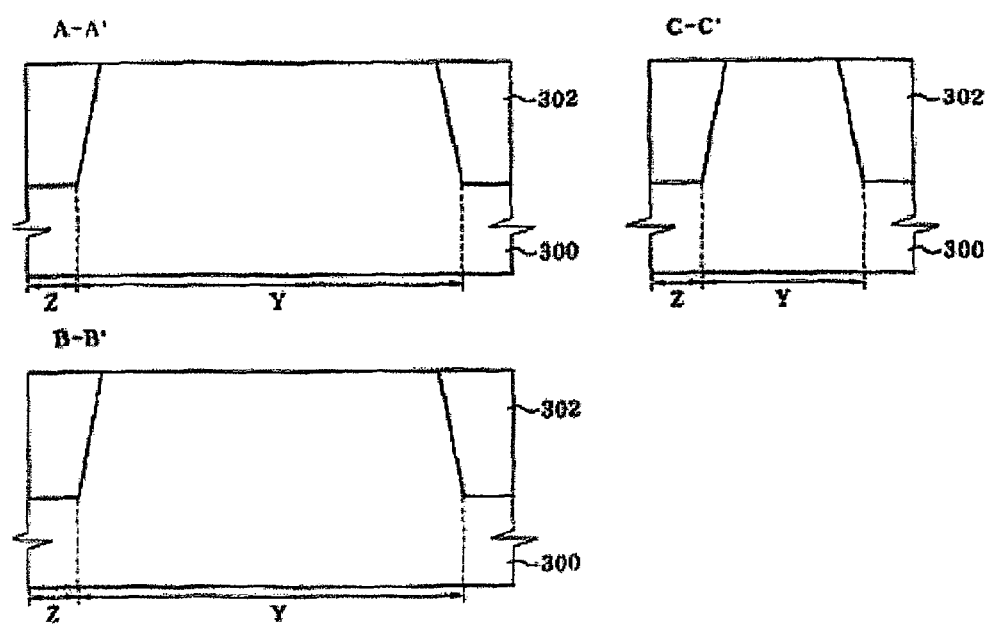

FIG. 3b shows process cross-sectional views taken along A-A' axis, B-B' axis and C-C' axis of FIG. 3a, respectively. Herein, A-A' axis and B-B' axis show parts cut in the width direction of the semiconductor device in FIG. 3a, and C-C' axis show a part cut lengthwise from the semiconductor device in FIG. 3a.

Figure 4A:
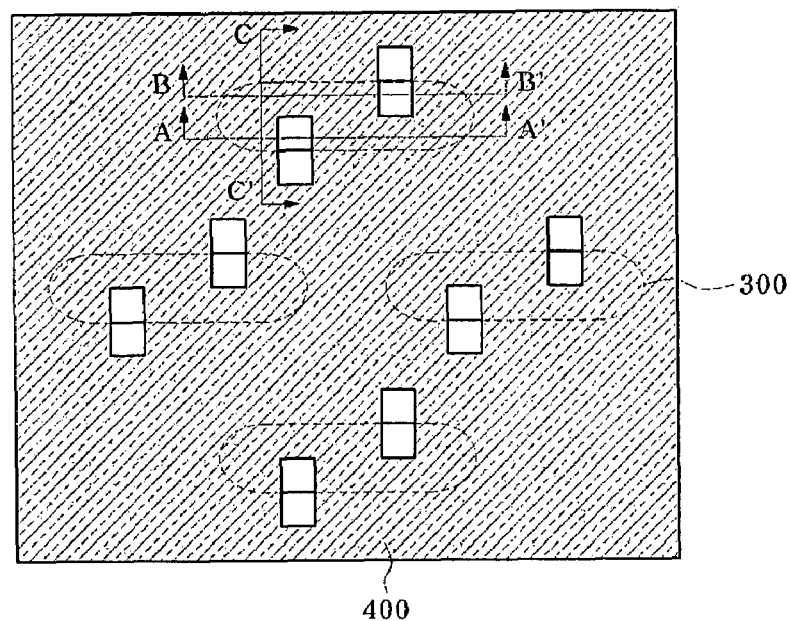
Figure 4B:
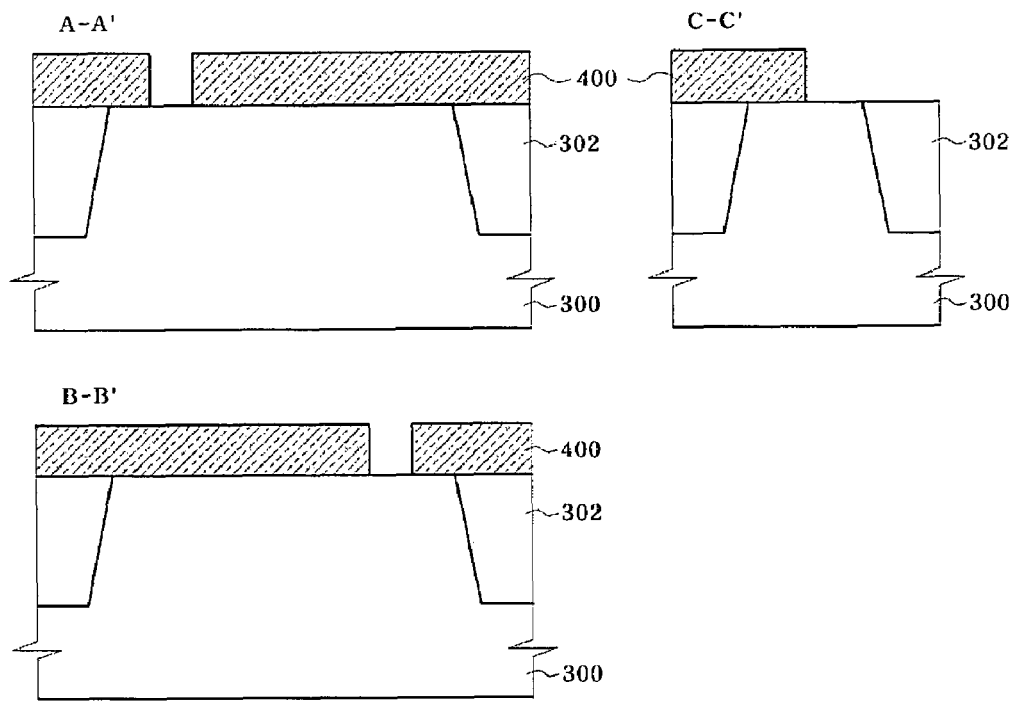

Next, referring to FIGS. 4a and 4b, a photoresist film is applied to the semiconductor substrate 300 and is then patterned to form a mask film pattern 400 such that both sides of an active region, among adjoining regions between the active region and isolation regions, are exposed to cross each other, thereby defining recess channel-forming regions. Herein, the mask film pattern 400 preferably employs a small bar-type mask film pattern 400, instead of conventional line-type mask film patterns. FIG. 4b shows process cross-sectional views taken along A-A' axis, B-B' axis and C-C' axis of FIG. 4a, respectively. Referring to views showing parts taken along the A-A' axis and the B-B' axis of FIG. 4b, the bar-type mask film pattern 400 is formed to cross each other, on both sides of an active region (Y).

Figure 5A:
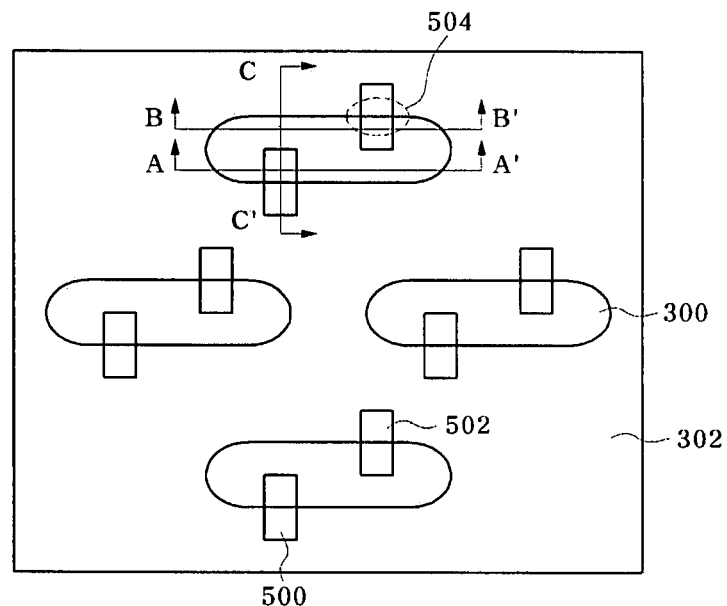
Figure 5B:
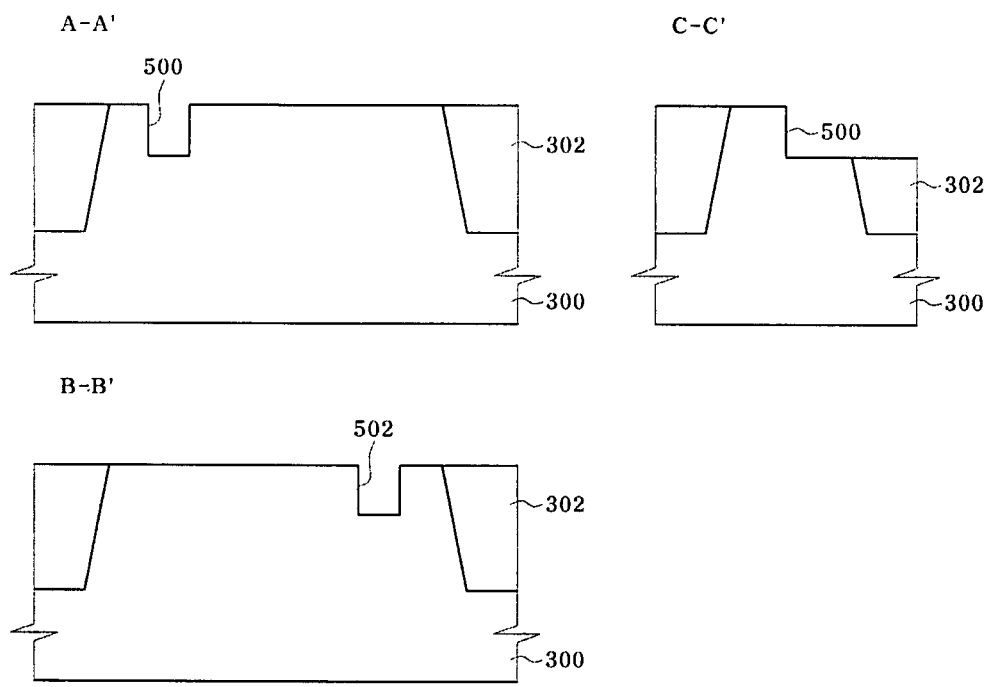

Next, referring to FIGS. 5a and 5b, etching is carried out using the mask film pattern 400 as a mask, thereby forming a first trench 500 and a second trench 502 on the semiconductor substrate. In this connection, isolation films 302 have a lower etching rate than the semiconductor substrate 300 and thus can form trenches having a depth shallower than the active layer (Y). In addition, both sides of the active region (Y) are exposed to cross each other to form the first trench 500 and second trench 502, and therefore the active region parts 504 (see FIG. 5a) adjacent to isolation films 302 are reduced to one part as compared to a conventional method, thereby being capable of improving electrical problems due to horn defects.

Figure 6A:
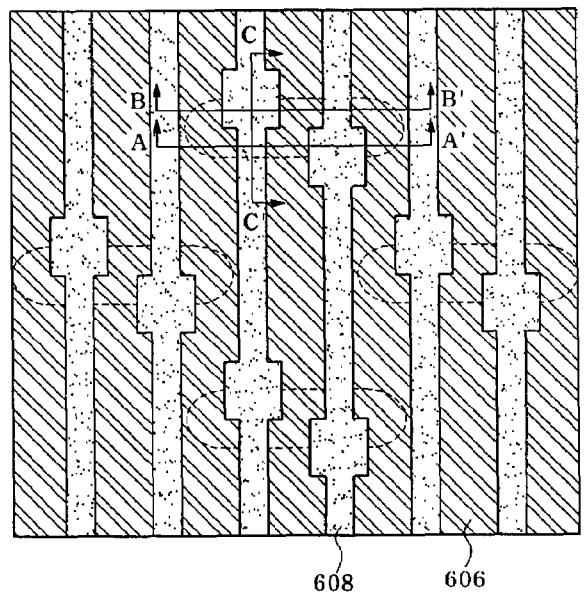
Figure 6B:
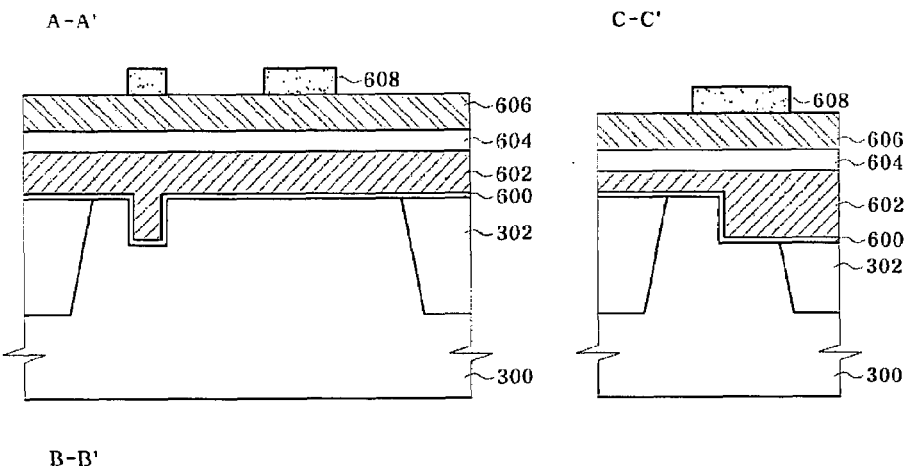
Figure 6B:
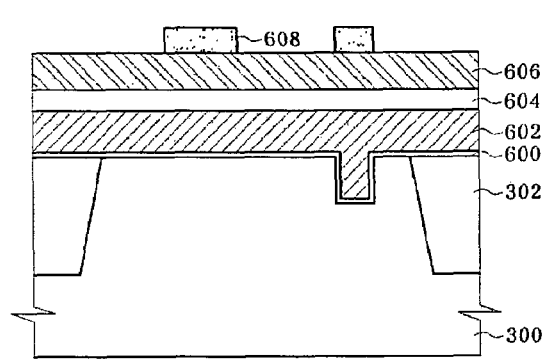

Referring to FIGS. 6a and 6b, a gate insulation film 600 and a polyfilm 602 are formed on the first and second trenches 500 and 502 and the entire surface of the semiconductor substrate 300. Herein, the gate insulation film 600 may be formed of an oxide film, and the polyfilm 602 may be formed through application of a conductive material such as polysilicon. The polyfilm 602 is formed to a thick thickness of about 1100□. Next, the polyfilm 602 is planarized to a thickness of about 650□ via chemical mechanical polishing (CMP). Unless the polyfilm 602 is planarized, a step occurs in gate lines and therefore voids may occur in the metal film. Next, a metal film 602 and a hard mask film 606 are sequentially deposited on the polyfilm 602 which was subjected to planarization, a photoresist film is applied to the hard mask film 606 and a photoresist film pattern 608 for forming gates is then formed. Herein, the metal film 602 may be formed of tungsten silicide, and the hard mask film 606 may be formed of a nitride film.

FIG. 6b shows process cross-sectional views taken along A-A' axis, B-B' axis and C-C' axis of FIG. 6a, respectively. Referring to FIG. 6b, the photoresist film pattern 608 for forming gates in accordance with the present invention is formed to exhibit a partial wave gate shape. That is, the remaining active regions, except for the parts in which the first and second trenches 500 and 502 were formed according to the bar-type mask film pattern, may be formed to have a broad gate width.

Figure 7A:
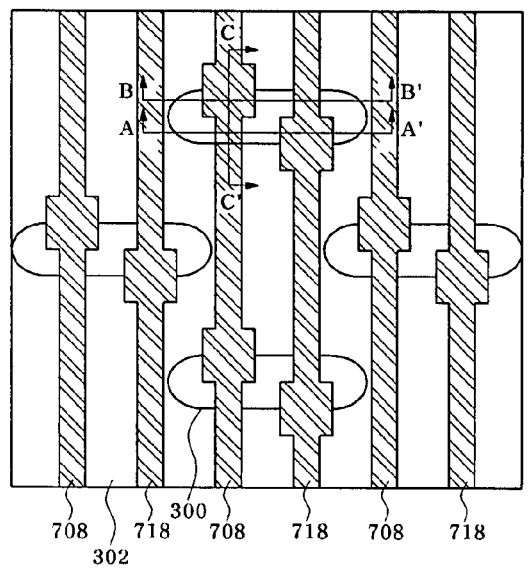

Referring to FIG. 7a, an etching process is carried out using the photoresist film pattern 608 for forming partial wave gates as a mask, thereby forming first and second gate lines 708 and 718, each overlapping with the first and second trenches 500 and 502. The first and second gate lines 708 and 718 are partially formed into a wave gate shape. In addition, the first and second gate lines 708 and 718 may be formed including hard mask film patterns 706 and 716, metal film patterns 704 and 714, conductive film patterns 702 and 712 and gate insulation film patterns 700 and 710. In this case, the parts in which the first and second trenches were not formed in the active region (Y) may be formed to have a broad gate width, thereby compensating for the channel length. As a result, it is possible to greatly increase the amount of driving current by reducing channel resistance at the same threshold voltage. Further, the number of horns is reduced to one from two horns, as compared to when making a recess using conventional line-type mask film patterns and thus lowering of the threshold voltage and dependence of back bias can be significantly reduced.

Figure 7B:
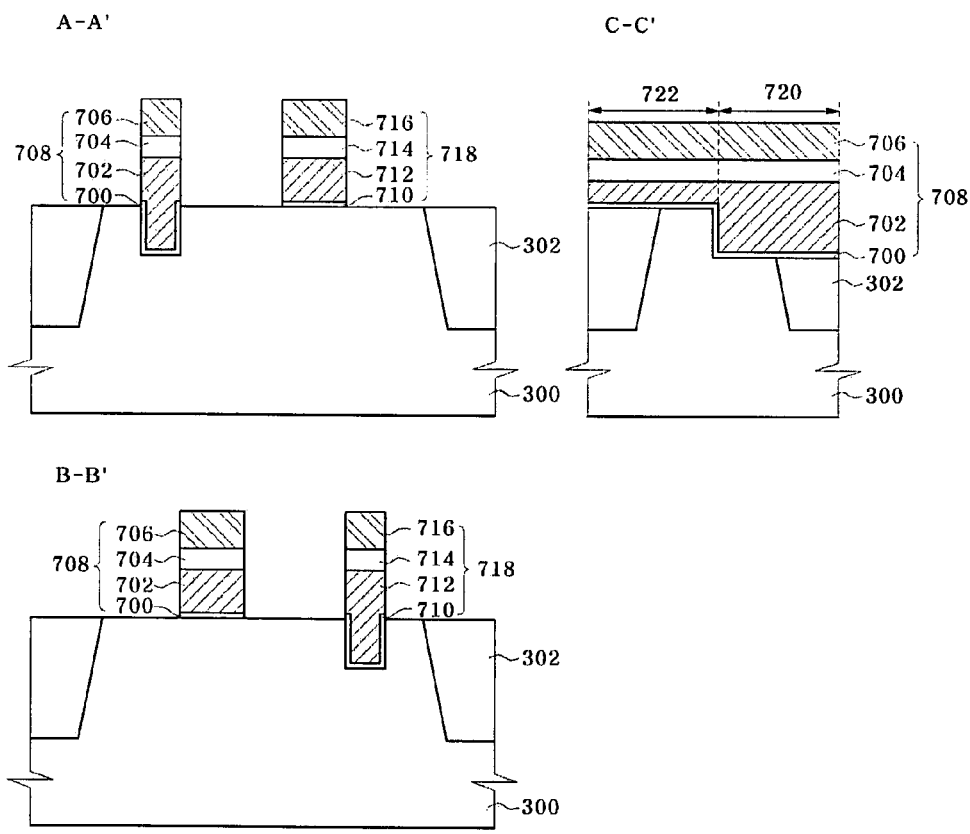

FIG. 7b shows process cross-sectional views taken along A-A' axis, B-B' axis and C-C' axis of FIG. 7a, respectively. Referring to FIG. 7b showing a cross section taken along the A-A' axis, the first gate line 708 and second gate line 718 have different gate widths in the active region. Referring to FIG. 7b showing a cross section taken along the B-B' axis, it can be seen that gate widths of the first gate line 708 and second gate line 718 are varied in the parts in which the bar-type mask film patterns were not formed, thereby forming wave-shaped gate lines.

As apparent from the above description, in a semiconductor device having recess channels in accordance with the present invention and a method for fabricating the same, both sides of the active region, among adjoining regions between the active region and isolation regions, are crossed with each other to form the first and second gate lines, thereby reducing the number of horns and therefore threshold voltage is decreased and dependence on back bias can be improved. Further, it is possible to increase the amount of driving current by reducing channel resistance at the same threshold voltage.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device having a recess channel, comprising:
    a semiconductor substrate having an isolation region and an active region defined by the isolation region;
    a first trench disposed on the semiconductor substrate, the first trench extending partially across the active region and across a first edge of the active region, thereby overlapping a portion of the active region and a portion of the isolation region;
    a second trench disposed on the semiconductor substrate, the second trench extending partially across the active region and across a second edge of the active region, thereby overlapping a portion of the active region and a portion of the isolation region;
    a gate insulation film disposed on the semiconductor substrate of the active region, including the first and second trenches;
    a first gate line disposed on the gate insulation film, the first gate line extending across the active region and fully filling the first trench; and
    a second gate line disposed on the gate insulation film, the second gate line extending across the active region and fully filling the second trench;
    wherein:
    the second edge is located on an opposite side of the active region relative to the first edge; and
    the first and second gate lines are spaced from each other.

2. The semiconductor device according to claim 1, wherein the first gate line has a first width in a region where the first gate line fully fills the first trench and a second width in a region where the first gate line does not overlap the first trench, the first width being smaller than the second width.

3. The semiconductor device according to claim 1, wherein the second gate line has a first width in a region where the second gate line fully fills the second trench and a second width in a region where the second gate line does not overlap the second trench, the first width being smaller than the second width.

* * * * *